United States Patent
Chen et al.

(10) Patent No.: US 12,113,535 B2
(45) Date of Patent: Oct. 8, 2024

(54) RING OSCILLATOR AND TEST METHOD

(71) Applicant: CHANGXIN MEMORY TECHNOLOGIES, INC., Hefei (CN)

(72) Inventors: Chan Chen, Hefei (CN); Anping Qiu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 224 days.

(21) Appl. No.: 17/837,055

(22) Filed: Jun. 10, 2022

(65) Prior Publication Data

US 2023/0299752 A1    Sep. 21, 2023

Related U.S. Application Data

(63) Continuation of application No. PCT/CN2022/089093, filed on Apr. 25, 2022.

(30) Foreign Application Priority Data

Mar. 18, 2022   (CN) .......................... 202210273250.7

(51) Int. Cl.
*H03K 3/03* (2006.01)
*G01R 31/28* (2006.01)
(Continued)

(52) U.S. Cl.
CPC ....... H03K 3/0315 (2013.01); G01R 31/2849 (2013.01); H03K 3/011 (2013.01); H03K 19/20 (2013.01)

(58) Field of Classification Search
CPC ............ G01R 31/2849; G01R 31/2642; G01R 31/2879; G01R 31/2884; H03K 19/20;
(Continued)

(56) References Cited

U.S. PATENT DOCUMENTS

2008/0155282 A1    6/2008   Gammie et al.
2009/0189703 A1    7/2009   Chuang et al.
(Continued)

FOREIGN PATENT DOCUMENTS

CN    107450010 A    12/2017
CN    107888172 A    4/2018
(Continued)

OTHER PUBLICATIONS

Mitsuhiko Igarashi et al., "NBTI/PBTI separated BTI monitor with 4.2x Sensitivity by Standard Cell Based Unbalanced Ring Oscillator", IEEE Asian Solid-State Circuits Conference Nov. 6-8, 2017, Seoul, Korea, total 4 pages.

*Primary Examiner* — Amy He
(74) *Attorney, Agent, or Firm* — Kilpatrick Townsend & Stockton LLP

(57) ABSTRACT

Embodiments provide a ring oscillator and test method. The ring oscillator includes a first logic gate, a second logic gate, and a switch circuit. The first logic gate is configured to receive a test signal. The second logic gate includes a first NAND gate and a first NOR gate connected in sequence. An output terminal of the second logic gate is connected to an input terminal of the first logic gate, and the second logic gate is configured to receive output of the first logic gate to form a loop. The switch circuit includes a first switch circuit and a second switch circuit. The first switch circuit may be configured to control on/off of a power supply terminal of the first NAND gate and a ground terminal of the first NOR gate. The second switch circuit is configured to control on/off of a ground terminal of the first NAND gate.

6 Claims, 1 Drawing Sheet

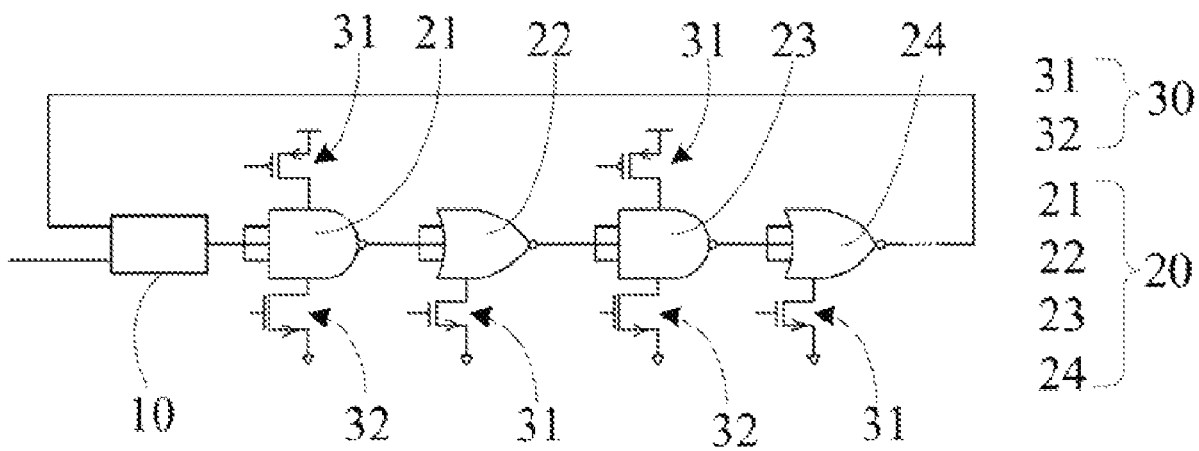

(51) Int. Cl.
*H03K 3/011* (2006.01)
*H03K 19/20* (2006.01)

(58) Field of Classification Search
CPC ...... H03K 3/011; H03K 3/0315; H01L 22/14; H01L 22/34
See application file for complete search history.

(56) References Cited

U.S. PATENT DOCUMENTS

| 2013/0015876 A1* | 1/2013 | Lai ..................... G01R 31/2642 |
| | | 324/762.01 |
| 2014/0197895 A1 | 7/2014 | Chen et al. |
| 2018/0089052 A1 | 3/2018 | Igarashi |

FOREIGN PATENT DOCUMENTS

| CN | 109428569 A | 3/2019 |
| JP | 2012151662 A | 8/2012 |

* cited by examiner

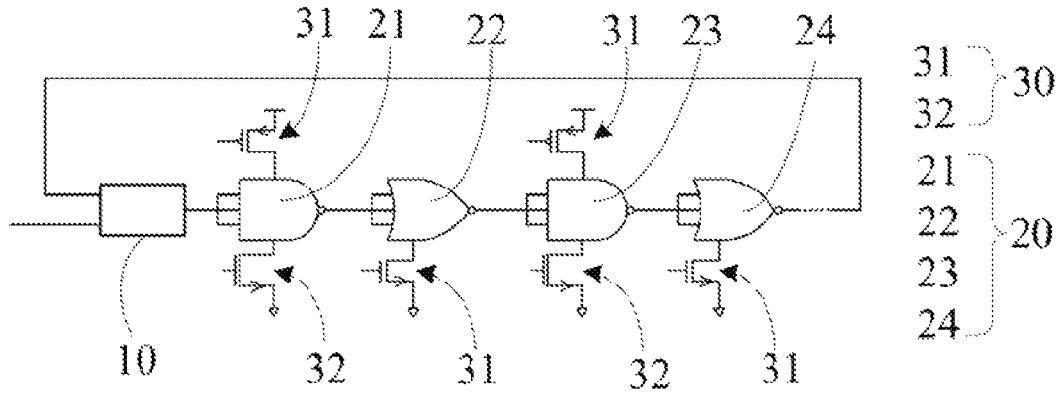

Fig. 1

Switch on each switch in the switch circuit to obtain an initial frequency of the ring oscillator, the initial frequency being an oscillation frequency of an initial signal outputted by the ring oscillator — S110

Set a test signal and send a control signal, the control signal being configured for controlling on/off of each switch in the switch circuit to control stresses borne different logic gates in the ring oscillator, and different control signals being configured for controlling the ring oscillator to bear different stress states during test — S120

Switch on each switch in the switch circuit after a preset time interval to obtain a stress frequency of the ring oscillator, the stress frequency being an oscillation frequency of a current test signal outputted by the ring oscillator — S130

Determine an impact of NBTI effects on the ring oscillator according to the initial frequency, the stress frequency, and the preset time interval — S140

Fig. 2

RING OSCILLATOR AND TEST METHOD

CROSS-REFERENCE TO RELATED APPLICATION

The present disclosure is a continuation of PCT/CN2022/089093, filed on Apr. 25, 2022, which claims priority to Chinese Patent Application No. 202210273250.7, titled "RING OSCILLATOR AND TEST METHOD" and filed on Mar. 18, 2022, the entire contents of which are incorporated herein by reference.

TECHNICAL FIELD

The present disclosure relates to the field of reliability test technology, and more particularly, to a ring oscillator and a test method.

BACKGROUND

In integrated circuit test technologies, as an important part of reliability test of a device, Negative Bias Temperature Instability (NBTI) test can test quality of the device and predict service life of the device. Generally, the NBTI test is performed by using a ring oscillator. However, the existing ring oscillator structure is not sensitive to the NBTI effects, resulting in unapparent differences between measurement results obtained before and after a stress test, thereby having negative impacts on accuracy of measurement. In addition, if it is unable to evaluate the impacts of the NBTI effects on the device under different stress states, in this case the service life of the device cannot be predicted comprehensively and accurately.

The above-mentioned information disclosed in this Background section is only for the purpose of enhancing the understanding of background of the present disclosure and may therefore include information that does not constitute prior art known to those of ordinary skill in the art.

SUMMARY

An objective of the present disclosure is to provide a ring oscillator and a test method, which can improve accuracy of Negative Bias Temperature Instability (NBTI) test.

To achieve the foregoing objective of the present disclosure, the present disclosure adopts the following technical solutions.

According to a first aspect of the present disclosure, there is provided a ring oscillator, which includes:
  a first logic gate configured to receive a test signal;
  a second logic gate comprising a first NAND gate and a first NOR gate connected in sequence, an output terminal of the second logic gate being connected to an input terminal of the first logic gate, and the second logic gate being configured to receive output of the first logic gate to form a loop; and
  a switch circuit comprising a first switch circuit and a second switch circuit, the first switch circuit being configured to control on/off of a power supply terminal of the first NAND gate and a ground terminal of the first NOR gate, and the second switch circuit being configured to control on/off of a ground terminal of the first NAND gate.

In an exemplary embodiment of the present disclosure, the second logic gate is further provided with a plurality of pairs of second NAND gates and second NOR gates, where an input terminal of the second NAND gate is connected to an output terminal of the first NOR gate, an output terminal of the second NAND gate is connected to an input terminal of the second NOR gate, and an output terminal of the second NOR gate is connected to the input terminal of the first logic gate.

In an exemplary embodiment of the present disclosure, a size of the first NAND gate and a size of the second NAND gate are smaller than a standard value, and a size of first NOR gate and a size of the second NOR gate are greater than the standard value.

In an exemplary embodiment of the present disclosure, the first logic gate is a third NAND gate or a third NOR gate.

In an exemplary embodiment of the present disclosure, the size of the first switch circuit is smaller than that the second switch circuit.

According to a second aspect of the present disclosure, there is provided a test circuit, which includes the above-mentioned ring oscillator.

According to a third aspect of the present disclosure, there is provided a test method for NBTI, which is applied to the above ring oscillator. The test method includes:
  switching on each switch in the switch circuit to obtain an initial frequency of the ring oscillator, the initial frequency being an oscillation frequency of an initial signal outputted by the ring oscillator;
  setting a test signal and sending a control signal, the control signal being configured for controlling on/off of each switch in the switch circuit to control stresses borne different logic gates in the ring oscillator, and different control signals being configured for controlling the ring oscillator to bear different stress states during test;
  switching on each switch in the switch circuit after a preset time interval to obtain a stress frequency, the stress frequency being an oscillation frequency of a current test signal outputted by the ring oscillator; and
  determining an impact of NBTI effects on the ring oscillator according to the initial frequency, the stress frequency, and the preset time interval.

In an exemplary embodiment of the present disclosure, the first logic gate is a third NAND gate, and the setting a test signal and sending a control signal further includes:
  setting an input terminal of the third NAND gate to a low level, and sending a first control signal configured for switching off the first switch circuit and the second switch circuit.

In an exemplary embodiment of the present disclosure, the first logic gate is a third NAND gate, and the setting a test signal and sending a control signal further includes:
  setting an input terminal of the third NAND gate to a low level, and sending a second control signal configured for switching off the first switch circuit and switching on the second switch circuit.

In an exemplary embodiment of the present disclosure, the first logic gate is a third NAND gate, and the setting a test signal and sending a control signal further includes:
  setting an input terminal of the third NAND gate to a low level, and sending a third control signal configured for switching on the first switch circuit and the second switch circuit.

In an exemplary embodiment of the present disclosure, the first logic gate is a third NOR gate, and the setting a test signal and sending a control signal further includes:
  setting an input terminal of the third NOR gate to a high level, and sending a fourth control signal configured for switching on the first switch circuit and the second switch circuit.

In an exemplary embodiment of the present disclosure, the first logic gate is a third NAND gate, and the setting a test signal and sending a control signal further includes:

setting an input terminal of the third NAND gate to a high level, and sending a fifth control signal configured for switching on the first switch circuit and the second switch circuit.

The technical solutions provided by the present disclosure can achieve the following beneficial effects.

When an NBTI test is performed on devices, because NBTI effects on the devices are more apparent to the NAND gates and the NOR gates, differences between measurement results obtained before and after a stress test are more apparent, which can improve test accuracy of the NBTI effects on the devices, and thus service life of the devices can be accurately predicted, especially the shortest service life. In addition, by controlling the first switch circuit and the second switch circuit in the switch circuit, on/off of the first NAND gate and the first NOR gate can be controlled, such that the stress state borne by the ring oscillator may be changed, and thus impacts of the NBTI effects on the devices may be evaluated according to different stress states borne by the ring oscillator during test. In this way, the impacts of different stress states on the devices under the NBTI test can be comprehensively evaluated, thereby further improving the accuracy of predicting the service life of the devices.

It is to be understood that the above general description and the detailed description below are merely exemplary and explanatory, and do not limit the present disclosure.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 1 is a schematic structural diagram of a ring oscillator according to an embodiment of the present disclosure; and FIG. 2 is a flowchart of a test method according to an embodiment of the present disclosure.

Reference numbers of main components in the accompanying drawings are as follows:

10—first logic gate; 20—second logic gate; 21—first NAND gate; 22—first NOR gate; 23—second NAND gate; 24—second NOR gate; 30—switch circuit; 31—first switch circuit; and 32—second switch circuit.

DETAILED DESCRIPTION

The exemplary embodiments will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of exemplary embodiments to those skilled in the art. The features, structures, or characteristics described may be combined in one or more embodiments in any suitable manner. In the following description, numerous concrete details are provided to give a full understanding of the embodiments of the present disclosure.

The features, structures, or characteristics described may be combined in one or more embodiments in any suitable manner. In the following description, numerous concrete details are provided to give a full understanding of the embodiments of the present disclosure. However, those skilled in the art will appreciate that the technical solutions in the present disclosure may be practiced without one or more of the concrete details, or other methods, elements, materials and so on may be employed. In other circumstances, known structures, materials or operations are not shown or described in detail for the avoidance of fuzziness of the main technological creativity of the present disclosure.

When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc. The terms "first" and "second" and so on are merely used as labels, and do not impose numerical limitations on objects thereof.

In integrated circuit test technologies, as an important part of reliability test of a device, Negative Bias Temperature Instability (NBTI) test can test quality of the device and predict service life of the device. Generally, the NBTI test is performed by using a ring oscillator. However, the existing ring oscillator structure is not sensitive to the NBTI effects, resulting in unapparent differences between measurement results obtained before and after a stress test, thereby having negative impacts on accuracy of measurement. In addition, if it is unable to evaluate the impacts of the NBTI effects on the device under different stress states, in this case the service life of the device cannot be predicted comprehensively and accurately.

An embodiment of the present disclosure provides a ring oscillator. As shown in FIG. 1, the ring oscillator may include a first logic gate 10, a second logic gate 20, and a switch circuit 30, where the first logic gate 10 may be configured to receive a test signal. The second logic gate 20 may include a first NAND gate 21 and a first NOR gate 22 connected in sequence, where an output terminal of the second logic gate 20 may be connected to an input terminal of the first logic gate 10, and the second logic gate 20 may be configured to receive input of the first logic gate 10 to form a loop. The switch circuit 30 may include a first switch circuit 31 and a second switch circuit 32, where the first switch circuit 31 may be configured to control on/off of a power supply terminal of the first NAND gate 21 and a ground terminal of the first NOR gate 22, and the second switch circuit 32 may be configured to control on/off of a ground terminal of the first NAND gate 21.

When an NBTI test is performed on devices, because NBTI effects on the devices are more apparent to the NAND gates and the NOR gates, differences between measurement results obtained before and after a stress test are more apparent, which can improve test accuracy of the NBTI effects on the devices, and thus service life of the devices can be accurately predicted. In addition, by controlling on/off of the first switch circuit 31 and the second switch circuit 32 in the switch circuit 30, a power supply state of the first NAND gate 21 and a power supply state of the first NOR gate 22 can be controlled. That is, stress states borne by the ring oscillator may be changed, and thus impacts of the NBTI effects on the devices may be evaluated according to different stress states borne by the ring oscillator during test. In this way, the impacts of the different stress states on the device under the NBTI test can be comprehensively evaluated, thereby further improving the accuracy of predicting the service life of the device.

Components of the ring oscillator provided by the embodiments of the present disclosure will be described in detail below with reference to the accompanying drawings:

In one embodiment of the present disclosure, the ring oscillator may include a first logic gate 10 and a second logic gate 20, where the second logic gate 20 may include a first NAND gate 21 and a first NOR gate 22 connected in sequence. An output terminal of the first logic gate 10 may be connected to an input terminal of the first NAND gate 21, an output terminal of the first NAND gate 21 may be connected to an input terminal of the first NOR gate 22, and an output terminal of the first NOR gate 22 may be connected to an input terminal of the first logic gate 10 to form a loop.

In some embodiments, the second logic gate 20 may also be provided with a plurality of pairs of second NAND gates 23 and second NOR gates 24. An input terminal of the second NAND gate 23 may be connected to the input terminal of the first NOR gate 22, an output terminal of the second NAND gate 23 may be connected to an input terminal of the second NOR gate 24, and an output terminal of the second NOR gate 24 may be connected to the input terminal of the first logic gate 10 to form a loop. In this way, by providing the plurality of pairs of second NAND gates 23 and second NOR gates 24, impacts of the NBTI effects on the first NAND gate 21 and the first NOR gate 22 under the stress states may be more accurately tested, such that the impacts of the NBTI effects on the service life of the device can be accurately evaluated.

In some embodiments, a size of the first NAND gate 21 and a size of the second NAND gate 23 may be greater than a standard value, and a size of first NOR gate 22 and a size of the second NOR gate 24 may be smaller than the standard value. It is generally believed that a size of a logic gate is related to drive capability of the logic gate. The larger the size of the logic gate is, the stronger the drive capability of the logic gate is, and the better anti-NBTI effects are. Furthermore, NOR gates are highly sensitive to MOS transistors (especially PMOS transistors). For this reason, by setting the size of the first NOR gate 22 and the size of the second NOR gate 24 to be smaller than the standard value, it is advantageous to further amplifying the impacts of the NBTI effects on the ring oscillator, such that the impacts of the NBTI effects on the device can be more accurately monitored. Furthermore, by setting the size of the first NAND gate 21 and the size of the second NAND gate 23 to be greater than the standard value, it is advantageous to ensuring that the overall drive capability of the ring oscillator meets requirements, there avoiding causing adverse impacts on the NBTI test due to insufficient drive capability.

In some embodiments, the first logic gate 10 may be a third NAND gate or a third NOR gate. When the first logic gate 10 is a third NAND gate, the third NAND gate may at least include one first input terminal and one second input terminal, where the first input terminal is configured to receive the test signal, and the second input terminal is connected to the output terminal of the second logic gate to form a loop.

In some embodiments, when the first logic gate 10 is a third NOR gate, the third NOR gate may at least include one third input terminal and one fourth input terminal. Similarly, the third input terminal is configured to receive the test signal, and the fourth input terminal is connected to the output terminal of the second logic gate to form a loop.

In one embodiment of the present disclosure, the ring oscillator may further include a power supply circuit. The power supply circuit may be configured to supply power to the first logic gate 10 and the second logic gate 20, such that the first logic gate 10 and the second logic gate 20 can work normally, thereby ensuring that the NBTI test can be performed. After the NBTI test is completed, the power supply circuit may be switched off to save energy.

In some embodiments, by controlling on/off of the first switch circuit 31 and the second switch circuit 32, connection between each of the NAND gates and NOR gates and the corresponding power supply circuit can be controlled, such that on/off of the ground terminal and the power supply terminal of each of the NAND gates and NOR gates can be controlled, thereby ensuring that each of the NAND gates and NOR gates has different stress states during the NBTI test. In this way, the impacts of the NBTI effects on the service life of the device under the different stress states can be more comprehensively and accurately evaluated.

In some embodiments, a size of the second switch circuit 32 may be larger than that of the first switch circuit 31. It is to be understood that the size of the first switch circuit 31 refers to an area size occupied by the first switch circuit 31, and the size of the second switch circuit 32 refers to an area size occupied by the second switch circuit 32. By setting the size of the second switch circuit 32 to be larger than that of the first switch circuit 31, it may be ensured that, when the second switch circuit 32 is switched on, the ground terminal of the first NAND gate 21 and the ground terminal of the second NAND gate 23 have more ideal power supply states, such that stress actions of the NBTI effects on the logic gates is further strengthened, accuracy of the NBTI test is improved, and reliability of device life prediction is guaranteed.

It is to be understood that in some embodiments, the size of the first switch circuit 31 may also be set larger than that of the second switch circuit 32, or the size of a part of the first switch circuit 31 connected to the power supply terminal of the logic gate is larger than that of the second switch circuit 32, or the size of a part of the first switch circuit 31 connected to the ground terminal of the logic gate is larger than that of the second switch circuit 32. By selectively adjusting the size of a part of the switch circuit, the stress actions of the NBTI effects on different logic gates or different components in the same logic gate can be strengthened, thereby further improving accuracy and comprehensiveness of the NBTI test. In addition, a high-level power supply connected to the power supply terminals of the first NOR gate 22 and the second NOR gate 24 is omitted in FIG. 1. The high-level power supply may be indirectly or directly connected to the power supply terminals of the first NOR gate 22 and the second NOR gate 24.

The embodiments of the present disclosure also provide a test circuit for testing the NBTI effects of a device. The test circuit may include the above ring oscillator.

In some embodiments, the test circuit may further include a frequency divider and a buffer. An output terminal of the ring oscillator may be connected to an input terminal of the frequency divider, an output terminal of the frequency divider may be connected to an input terminal of the buffer, and an output terminal of the buffer may be connected to a measuring instrument, which may be configured to analyze the impacts of the NBTI effects on the device.

In some embodiments, the test circuit may further include a controller, which may be connected to the switch circuit 30. The controller may be configured to send a control signal to the switch circuit 30, and the switch circuit 30 may be switched on or off in response to the control signal sent by the controller. That is, on/off of the switch circuit 30 may be conveniently controlled by the controller, such that different working states of the ring oscillator can be switched. In this way, the impacts of the NBTI effects on the ring oscillator under different working states may be determined, and thus the impacts of the NBTI effects on the service life of the device may be determined.

In some embodiments, the above-mentioned controller may also include a programmable logic controller (PLC), a programmable automation controller (PAC), a bus industrial control computer, and an embedded controller, etc. The above-mentioned controller may also be some components or circuits in a central processing unit (CPU).

The embodiments of the present disclosure also provide a test method for NBTI, which is applied to the above-mentioned ring oscillator. As shown in FIG. 2, the test method may include following steps:

Step S110: switching on each switch in the switch circuit 30 to obtain an initial frequency of the ring oscillator, the initial frequency being an oscillation frequency of an initial signal outputted by the ring oscillator;

Step S120: setting a test signal and sending a control signal, the control signal being configured for controlling on/off of each switch in the switch circuit 30 to control stresses borne different logic gates in the ring oscillator, and different control signals being configured for controlling the ring oscillator to bear different stress states during test;

Step S130: switching on each switch in the switch circuit 30 after a preset time interval to obtain a stress frequency of the ring oscillator, the stress frequency being an oscillation frequency of a current test signal outputted by the ring oscillator; and Step S140: determining an impact of NBTI effects on the ring oscillator according to the initial frequency, the stress frequency, and the preset time interval.

In the above-mentioned test method of the present disclosure, when the NBTI test is started, each switch in the switch circuit 30 in the ring oscillator may be switched on first. After each switch is switched on, the ring oscillator is in an oscillating state, such that an initial frequency of the ring oscillator may be obtained, where the initial frequency is an oscillation frequency of an initial signal outputted by the ring oscillator. After the initial frequency is obtained, a test signal configured for inputting the first logic gate 10 and a control signal configured for controlling on/off of each switch in the switch circuit 30 are set, to control the logic gates in the ring oscillator to bear stresses based on the control signal. When different control signals are sent, the different control signals may be configured for causing the ring oscillator to bear different stress states during the NBTI test. Each switch in the switch circuit 30 is switched on again after the preset time interval, to obtain the stress frequency of the ring oscillator. Through the above steps, impacts of the NBTI effects on the ring oscillator can be determined according to the initial frequency, the stress frequency, and the preset time interval. Next, the impacts of the NBTI effects on the device can be determined, such that the service life of the device can be comprehensively and accurately evaluated.

In some embodiments, Step S110 may further include Step S210:

Step S210: connecting a device under test to the test circuit, and setting a temperature of an experimental environment to be a high temperature or a normal temperature.

Further, a semiconductor parameter analyzer may be employed to apply stress to and measure the device under test.

In some embodiments, Step S120 may further include:
when the first logic gate 10 is the third NAND gate, setting an input terminal of the third NAND gate to a low level, and sending a first control signal configured for switching off the first switch circuit 31 and the second switch circuit 32. In some embodiments, when sending the first control signal, the first control signal may cause the first switch circuit 31 and the second switch circuit 32 to be switched off. When the first switch circuit 31 and the second switch circuit 32 are switched off, the power supply terminal of the first NAND gate 21 is switched off, the ground terminal of the first NOR gate 22 and the ground terminal of the second NOR gate 24 are switched off, and the ground terminal of the first NAND gate 21 and the ground terminal of the second NAND gate 23 are switched off. Through the above steps, a first test circuit may be formed. In the first test circuit, only the third NAND gate and the first NAND gate 21 are under stress, and none of other logic gates is under stress, so the ring oscillator is in a stable state. For this reason, the ring oscillator has different stress states during test, and the current state of the ring oscillator is recorded as a first working state. This can be used as a comparison for the NBTI test.

In some embodiments, Step S120 may further include:
when the first logic gate 10 is the third NAND gate, setting an input terminal of the third NAND gate to a low level, and sending a second control signal configured for switching off the first switch circuit 31 and switching on the second switch circuit 32. In some embodiments, when sending the second control signal, the second control signal may be configured to switch off the first switch circuit 31 and switch on the second switch circuit 32. When the first switch circuit 31 is switched off and the second switch circuit 32 is switched on, the power supply terminal of the first NAND gate 21 and the power supply terminal of the second NAND gate 23 are switched off, the ground terminal of the first NOR gate 22 and the ground terminal of the second NOR gate 24 are switched off, and the ground terminal of the first NAND gate 21 and the ground terminal of the second NAND gate 23 are switched on. Through the above steps, a second test circuit may be formed, in which the third NAND gate, the first NAND gate 21 and the first NOR gate 22 are under stress. For this reason, the ring oscillator has different stress states during test, and the current state of the ring oscillator is recorded as a second working state. That is, the impacts of the NBTI effects on the current second working state of the ring oscillator can be reflected based on the stresses borne by the several logic gates mentioned above.

In some embodiments, Step S120 may further include:
when the first logic gate 10 is the third NAND gate, setting an input terminal of the third NAND gate to a low level, and sending a third control signal configured for switching on the first switch circuit 31 and the second switch circuit 32. In some embodiments, when the first switch circuit 31 and the second switch circuit 32 are switched on, the power supply terminal of the first NAND gate 21, the ground terminal of the first NOR gate 22, the power supply terminal of the second NAND gate 23 and the ground terminal of the second NOR gate 24 are all switched on; and the ground terminal of the first NAND gate 21 and the ground terminal of the second NAND gate 23 are both switched on. Through the above steps, a third test circuit may be formed, in which the third NAND gate, the first NAND gate 21, the first NOR gate 22 and the second NAND gate 23 are under stress. For this reason, the ring oscillator has different stress states during test, and the current state of the ring oscillator is recorded as a third working state. That is, the impacts of the NBTI effects on the current third working state of the ring oscillator can be reflected based on the stresses borne by the several logic gates mentioned above.

In some embodiments, Step S120 may further include:

when the first logic gate 10 is a third NOR gate, setting an input terminal of the third NOR gate to a high level, and sending a fourth control signal configured for switching on the first switch circuit 31 and the second switch circuit 32. In some embodiments, when the first switch circuit 31 and the second switch circuit 32 are switched on, the power supply terminal of the first NAND gate 21, the ground terminal of the first NOR gate 22, the power supply terminal of the second NAND gate 23 and the ground terminal of the second NOR gate 24 are all switched on; and the ground terminal of the first NAND gate 21 and the ground terminal of the second NAND gate 23 are both switched on. Through the above steps, a fourth test circuit may be formed, in which the third NAND gate, the first NAND gate 21, the first NOR gate 22 and the second NAND gate 23 are under stress. Because the third NAND gate, the first NAND gate 21, the first NOR gate 22 and the second NAND gate 23 are under stress and the first logic gate 10 is the third NOR gate, the fourth test circuit formed is different from the third test circuit. The current state of the ring oscillator is recorded as a fourth working state. That is, the impacts of the NBTI effects on the current fourth working state of the ring oscillator can be reflected based on the stresses borne by the several logic gates mentioned above.

In some embodiments, Step S120 may further include:

when the first logic gate 10 is a third NAND gate, setting an input terminal of the third NAND gate to a high level, and sending a fifth control signal configured for switching on the first switch circuit 31 and the second switch circuit 32. When the first switch circuit 31 and the second switch circuit 32 are switched on, the power supply terminal of the first NAND gate 21, the ground terminal of the first NOR gate 22, the power supply terminal of the second NAND gate 23 and the ground terminal of the second NOR gate 24 are all switched on; and the ground terminal of the first NAND gate 21 and the ground terminal of the second NAND gate 23 are both switched on. Through the above steps, a fifth test circuit may be formed, in which the third NAND gate, the first NAND gate 21, the first NOR gate 22, the second NAND gate 23 and the second NOR gate 24 are all under stress. For this reason, the ring oscillator works normally and outputs the oscillation frequency according to the test signal. The current state of the ring oscillator is recorded as a fifth working state. That is, the impacts of the NBTI effects on the current fifth working state of the ring oscillator can be reflected based on the stresses borne by the several logic gates mentioned above.

In some embodiments, Step S130 may further include:

determining the preset time interval may include:

determining, by the controller, a moment of sending the control signal as a first initial moment, where the control signal is configured for controlling on/off of each switch in the switch circuit 30, thereby controlling the stresses borne by each logic gate;

determining, by the controller, a moment of sending an ON signal as a second initial moment, where the ON signal is configured for controlling on/off of each switch in the switch circuit 30; and determining the preset time interval according to the first initial moment and the second initial moment.

In some embodiments, the determining the preset time interval according to the first initial moment and the second initial moment may include:

obtaining the preset time interval by subtracting the first initial moment from the second initial moment.

In some embodiments, Step S140 may further include:

after the NBTI test is completed, sending, by the controller a control signal configured for switching off the first switch circuit 31 and the second switch circuit 32 to save electric energy, thus playing a role of power saving.

It is to be noted that steps of the test method for NBTI in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution, which shall be considered as a part of the present disclosure.

It is to be understood that the present disclosure does not limit its application to the detailed structure and arrangement of the components of the ring oscillator proposed in this specification. The present disclosure can have other embodiments and can be implemented and carried out in various ways. The foregoing variations and modifications fall within the scope of the present disclosure. It is to be understood that the present disclosure disclosed and defined in this specification extends to all fungible combinations of two or more individual features that are mentioned or apparent from the text and/or drawings. All of these different combinations constitute various fungible aspects of the present disclosure. The embodiments in this specification explain the best modes known for practicing the present disclosure and will enable those skilled in the art to utilize the present disclosure.

What is claimed is:

1. A ring oscillator comprising:
a first logic gate configured to receive a test signal, wherein the first logic gate is a third NOR gate;
a second logic gate comprising a first NAND gate and a first NOR gate connected in sequence, an output terminal of the second logic gate being connected to an input terminal of the first logic gate, and the second logic gate being configured to receive output of the first logic gate to form a loop; and
a switch circuit comprising a first switch circuit and a second switch circuit, the first switch circuit being configured to control on/off of a power supply terminal of the first NAND gate and a ground terminal of the first NOR gate, and the second switch circuit being configured to control on/off of a ground terminal of the first NAND gate.

2. The ring oscillator according to claim 1, wherein the second logic gate is further provided with a plurality of pairs of second NAND gates and second NOR gates, an input terminal of the second NAND gate being connected to an output terminal of the first NOR gate, an output terminal of the second NAND gate being connected to an input terminal of the second NOR gate, and an output terminal of the second NOR gate being connected to the input terminal of the first logic gate.

3. The ring oscillator according to claim 2, wherein a size of the first NAND gate and a size of the second NAND gate are smaller than a standard value, a size of first NOR gate and a size of the second NOR gate being greater than the standard value.

4. The ring oscillator according to claim 1, wherein a size of the first switch circuit is smaller than a size of the second switch circuit.

5. A test circuit comprising a ring oscillator, wherein the ring oscillator comprises:
  a first logic gate configured to receive a test signal, wherein the first logic gate is a third NOR gate;
  a second logic gate comprising a first NAND gate and a first NOR gate connected in sequence, an output terminal of the second logic gate being connected to an input terminal of the first logic gate, and the second logic gate being configured to receive output of the first logic gate to form a loop; and
  a switch circuit comprising a first switch circuit and a second switch circuit, the first switch circuit being configured to control on/off of a power supply terminal of the first NAND gate and a ground terminal of the first NOR gate, and the second switch circuit being configured to control on/off of a ground terminal of the first NAND gate.

6. A test method for negative bias temperature instability (NBTI) being applied to the ring oscillator according to claim 1, the test method comprising:
  switching on each switch in the switch circuit to obtain an initial frequency of the ring oscillator, the initial frequency being an oscillation frequency of an initial signal outputted by the ring oscillator;
  setting a test signal and sending a control signal, the control signal being configured for controlling on/off of each switch in the switch circuit to control stresses borne different logic gates in the ring oscillator, and different control signals being configured for controlling the ring oscillator to bear different stress states during test;
  switching on each switch in the switch circuit after a preset time interval to obtain a stress frequency, the stress frequency being an oscillation frequency of a current test signal outputted by the ring oscillator; and
  determining an impact of NBTI effects on the ring oscillator according to the initial frequency, the stress frequency, and the preset time interval; and, wherein
  setting the test signal and sending the control signal further comprises:
  setting an input terminal of the third NOR gate to a high level, and sending a fourth control signal configured for switching on the first switch circuit and the second switch circuit.

\* \* \* \* \*